United States Patent [19]

Resneau et al.

[11] Patent Number: 4,510,470
[45] Date of Patent: Apr. 9, 1985

[54] ELECTRO-ACOUSTIC DELAY LINE OPERATING IN TRANSMISSION

[75] Inventors: Jean C. Resneau; Jean Puyhaubert; Evelyne Da Silva; Claude Lamontagne, all of Paris, France

[73] Assignee: Thomson CSF, Paris, France

[21] Appl. No.: 468,598

[22] Filed: Feb. 22, 1983

[30] Foreign Application Priority Data

Feb. 26, 1982 [FR] France .................. 82 03263

[51] Int. Cl.³ .................................. H03H 9/36
[52] U.S. Cl. .................. 333/142; 333/143; 333/149
[58] Field of Search ............... 333/141–149, 333/186–188; 330/5, 5.5

[56] References Cited

U.S. PATENT DOCUMENTS 3,317,861 5/1967 Kompfner .................... 333/142
3,317,862 5/1967 Fitch .......................... 333/143

FOREIGN PATENT DOCUMENTS 1533043 1/1969 France .
2144956 2/1973 France .
2345729 10/1977 France .

Primary Examiner—Marvin L. Nussbaum
Attorney, Agent, or Firm—Cushman, Darby & Cushman

[57] ABSTRACT

A transmission-type electro-acoustic delay line comprises an acoustic medium delimited by a cylindrical lateral surface, a plane terminal surface on which are fixed two symmetrical transducers, and a focusing terminal surface in the form of a spherical cap. The angle formed by the plane surface and the axis of revolution of the spherical cap is less than 90° by an angle such that the incident acoustic wave undergoes a single reflection on the focusing cap and such that the reflected acoustic wave is concentrated at the level of the output transducer.

9 Claims, 4 Drawing Figures

FIG_1
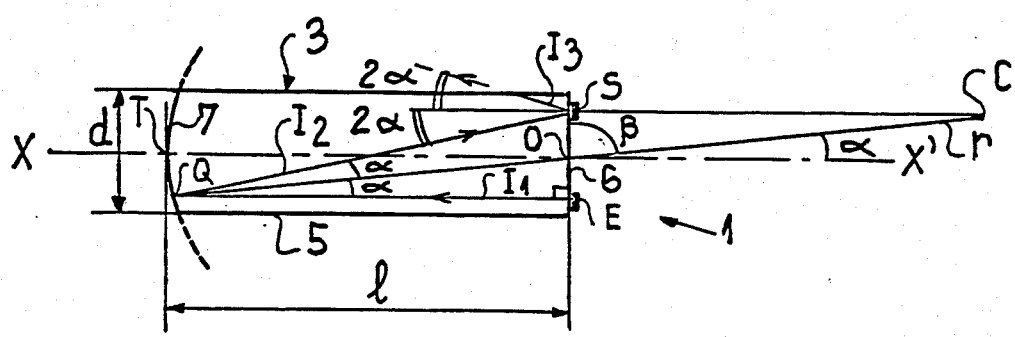
FIG_2
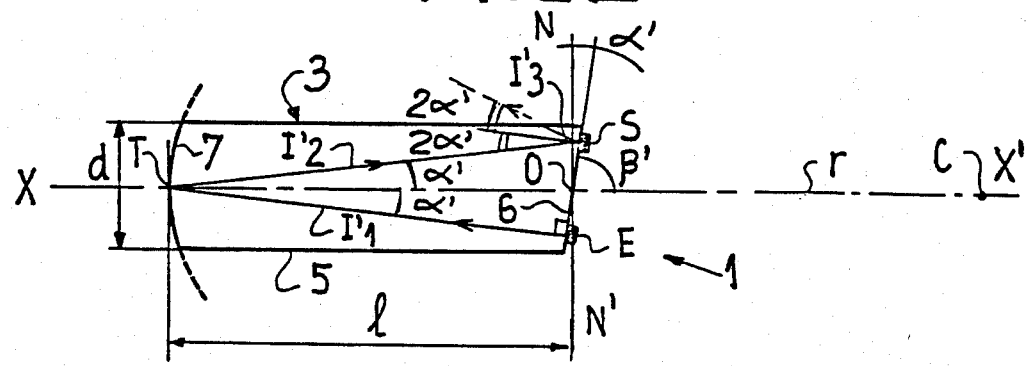
FIG_3
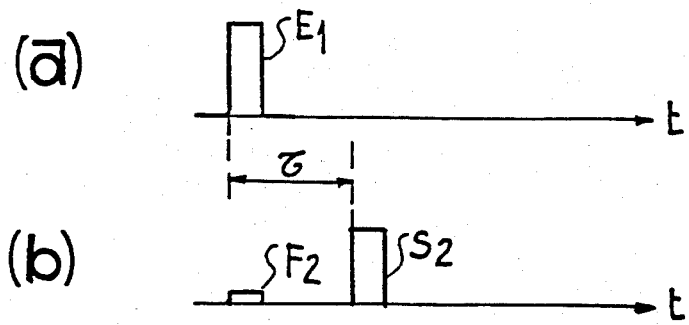

ELECTRO-ACOUSTIC DELAY LINE OPERATING IN TRANSMISSION

This invention relates generally to electro-acoustic delay lines for volume waves or surface waves, and relates more particularly to a microwave delay line operating in transmission.

Generally, a transmission-type delay line, for example, for volume waves, comprises an acoustic propagation medium constituted by a monocrystalline delaying material, and two piezoelectric transducers transforming an electromagnetic wave into an acoustic wave and vice versa, fixed either respectively on two opposite terminal faces of the acoustic medium, or on a single terminal face of the medium.

Different structures of transmission-type electro-acoustic delay lines are known, the two transducers of which are fixed on a single terminal face of the acoustic medium. Reference is made to German patent application No. 1 566 015 filed on Dec. 5, 1967 in the name of TELEFUNKEN. According to this patent application, the delay line comprises an acoustic medium delimited by a cylindrical lateral surface, a first plane terminal surface perpendicular to the axis of symmetry of the cylinder, said axis passing through the middle of the plane surface, and a second terminal surface in the form of a spherical cap ensuring a focusing of the acoustic wave, the centre of curvature of which is situated on the axis of symmetry of the cylinder, and the radius of curvature of which is equal to twice the length of the cylinder, so that the focal plane of the cap coincides with the plane terminal surface of the acoustic medium. Therefore, the angle formed by the plane terminal surface and the axis of symmetry of the cylinder on which is centered the spherical cap, is equal to 90°. Furthermore, the two piezoelectric transducers, respectively, i.e. the input and the output transducers, are symmetrically fixed with respect to the middle of the plane terminal surface of the medium, the acoustic wave produced by the input transducer being perpendicular to said plane surface. Through stimulation of the input transducer at a given frequency, the incident acoustic wave, parallel to the axis of the cylinder, undergoes a first reflection on the focusing spherical cap, then the reflected wave is concentrated in the middle of the plane terminal surface where it is again reflected. This latter reflected wave undergoes a second reflection on the focusing cap, and is thereafter concentrated at the level of the output transducer which is symmetrical with the input transducer, the acoustic wave having thus passed there and back twice through the medium. By reason of symmetry, the acoustic wave follows the inverse path of that described immediately above.

Taking into account, for example, that the acoustic wave passes there and back twice through the medium, the delay line described herein-above delivers a single echo delayed signal, the delay of which corresponds to the duration of the passage there and back twice by the acoustic wave through the medium, this duration being proportional to the length of the path of said wave through the acoustic medium.

However, such a delay line presents drawbacks. In fact, for a microwave input signal constituted, for example, by a pulse, the output signal produced by the line comprises a first pulse, known as "direct leakage", which presents a relatively high amplitude, this direct leakage being due to the coupling between the input transducer and the output transducer, and a second pulse representing a parasitic echo due to the reflection of the acoustic wave in the middle of the plane terminal surface of the acoustic medium, this parasitic echo preceding a third pulse constituting the first echo. By reason of symmetry of the path of the acoustic wave, the output signal comprises, after the first echo, three other pulses representing parasitic echo and preceding a pulse constituting the second echo, and so forth.

The aim of the present invention is to overcome these drawbacks by proposing a transmission-type electro-acoustic delay line, the transducers of which are fixed on a single terminal face of the acoustic medium, that is simple to produce and allows the obtainment of both a single echo delayed signal, due to the dissymetrical path of the acoustic wave, without any parasitic echo, and a direct signal due to the coupling between the two transducers presenting a low amplitude.

To this end, the invention concerns an electro-acoustic delay line operating in transmission, comprising:
an acoustic wave propagation medium delimited by at least one lateral surface, a first plane terminal surface and a second terminal surface of revolution ensuring a focusing of said acoustic wave;
an input transducer and an output transducer transforming an electromagnetic wave into an acoustic wave and vice versa, said two transducers being positioned on said plane terminal surface and being symmetrical with respect to the middle of said plane surface, the acoustic wave produced by said input transducer being perpendicular to said plane terminal surface; wherein the angle formed by said plane terminal surface and the axis of revolution of said second terminal surface passing through the middle of said plane terminal surface is less than 90° by a complementary angle such that the acoustic wave produced by said input transducer undergoes a single reflection on said focusing surface of revolution and such that the acoustic wave reflected on said surface of revolution is concentrated at the level of said output transducer, thus allowing the obtention of a single echo delayed signal.

Other features of the invention will be more apparent upon consideration of the following description and accompanying drawings, wherein:

FIG. 1 shows diagrammatically a first embodiment of a delay line according to the invention;

FIG. 2 shows diagrammatically a second embodiment of a delay line according to the invention; and FIG. 3, $a$ and $b$ shows respectively in function of time, an input signal and the output response of the delay line according to the invention.

According to a first preferred embodiment, shown FIG. 1, a delay line 1 of the transmission-type, for example, for volume waves, comprises an acoustic propagation support or medium 3, constituted by a delaying material, such as for example glass or corundum.

The medium 3 is delimited by a lateral surface, for example, a cylindrical surface 5, having an axis of symmetry $XX'$, a first polished plane terminal surface 6, perpendicular to the axis $XX'$ passing through the middle 0 of said plane surface, and a second terminal surface of revolution constituted for example by a polished spherical cap 7, eccentric with respect to axis $XX'$, and ensuring a focusing of the acoustic wave.

The radius of curvature $r$ of cap 7 is substantially equal to twice the given length $l$ of the acoustic medium 3, so that the focal plane of the cap 7 coincides with the plane surface 6 of the medium. The given length l of the medium is determined as being the distance separating the middle 0 of the plane surface 6 from the tangential point T of the spherical cap 7. The diameter of the cylindrical lateral surface 5 is represented as d in FIG. 1.

It will be noted that the acoustic medium can be produced from a parallelepiped, and that the spherical cap can be replaced by any surface of revolution, such as for example a portion of a paraboloid or an ellipsoid, without departing from the scope of the invention.

As appears from FIG. 1, the delay line 1 also comprises two piezoelectric transducers, i.e. an input transducer E and an output transducer S, fixed on the plane terminal surface 6 and symmetrical with respect to middle 0 of said surface.

The input transducer E, connected to a microwave stimulation circuit, produces an incident acoustic wave $I_1$ which is perpendicular to the plane terminal surface 6 of the acoustic medium.

As can be seen in FIG. 1, the angle $\beta$ formed by the plane surface 6 and the straight line passing through the middle 0 of said plane surface and the centre of curvature C of the spherical cap 7 is less than 90° by a complementary angle $\alpha$ formed by said straight line passing through points 0 and C, and the axis of symmetry XX' of the cylindrical lateral surface 5, this axis constituting the longitudinal axis of the acoustic medium 3. Therefore, the spherical cap 7 is inclined with respect to the longitudinal axis of the medium 3 of said angle $\alpha$ constituting the complement at 90° of angle $\beta$.

In a general manner, for any focusing surface of revolution, angle $\beta$ is formed by the plane terminal surface and the axis of revolution of the focusing surface passing through the middle of said plane surface, and is such that $\beta = 90° - \alpha$ in which $\alpha$ is chosen so that the acoustic wave produced by the input transducer undergoes a single reflection on the focusing surface, and so that the acoustic wave reflected on the focusing surface is concentrated at the level of the output transducer.

Furthermore, the input transducer E and the output transducer S shown in FIG. 1 are each positioned adjacent to an edge of the cylindrical lateral surface 5 of the acoustic medium, so that said transducers are spaced apart from each other, thus allowing the reduction of the intensity of the signal transmitted by direct coupling between the transducers.

Since radius of curvature r of the spherical cap 7 is substantially equal to twice the length l of the acoustic medium, the straight line passing through the output transducer S and the centre of curvature C of the cap 7 is parallel to the incident acoustic wave $I_1$ produced by input transducer E.

Thus, by this construction, the acoustic wave $I_1$ is reflected in a point Q of the cap 7 situated on the straight line passing through the middle 0 of the plane surface 6 and the centre of curvature C, and with an angle of reflection equal to the complementary angle $\alpha$. The reflected acoustic wave $I_2$ is thereafter concentrated at the level of the output transducer S, and is then reflected on the plane surface 6 with an angle of reflection equal to $2\alpha$. Immediately, the acoustic wave $I_3$ reflected on the plane surface 6 is reflected on the cylindrical lateral surface 5 of the medium 3. A single echo delayed signal is thus obtained at the output of transducer S.

In order to absorb acoustic wave $I_3$ reflecting on the cylindrical lateral surface 5, the delay line comprises moreover absorption means constituted, for example, by a layer of varnish deposited on said lateral surface, so that the single echo delayed signal thus obtained is free of any parasitic echo.

Diagram 3a shows in function of time t a microwave input signal constituted, for example, by a pulse $E_1$ of a given level.

Diagram 3b shows the response to this pulse signal $E_1$, obtained at the output of the delay line of FIG. 1.

This output signal comprises a pulse $F_2$ of low amplitude, representing the direct coupling between the two transducers, and a pulse $S_2$ representing the single echo delayed signal and preceded by no other parasitic echo, the delay $\tau$ of the signal $S_2$ being proportional to the length of the path of the acoustic wave in the propagation medium.

According to a second embodiment of the invention, shown in FIG. 2, and in which the elements identical to those of FIG. 1 are designated by the same references, the spherical cap 7 is centered in C on the longitudinal axis XX' of the acoustic medium 3, said axis passing through the middle 0 of the plane surface 6 and the radius of curvature r of the cap being substantially equal to twice the length l of the medium.

Moreover, the plane terminal surface 6 is inclined with respect to the normal NN' at the longitudinal axis XX' at the medium 3 of an angle $\alpha'$ determined so that the incident acoustic wave $I'_1$, perpendicular to the plane surface 6 and produced by the input transducer E, undergoes a single reflection on the focusing spherical cap 7, and so that the wave reflected on the spherical cap is concentrated at the level of the output transducer S. Thus, angle $\alpha'$ constitutes the complement at 90° of angle $\beta'$ formed by the plane surface 6 and the axis XX' of the medium 3 on which is centered the cap 7, i.e. $\beta' = 90° - \alpha'$.

Furthermore, each transducer E and S is fixed on the plane surface 6 of the medium, and is thus located far from middle 0 of the plane surface, thus allowing reduction of the direct coupling between the two transducers.

By this construction, the acoustic wave $I'_1$ undergoes a reflection at tangential point T of the focusing cap 7 situated on the longitudinal axis XX' of the medium, the angle of reflection being equal to the complementary angle $\alpha'$. The acoustic wave thus reflected $I'_2$ is thereafter concentrated at the level of the output transducer S, and is reflected on the plane surface 6 with an angle of reflection equal to $2\alpha'$.

After reflection on the plane surface 6, the acoustic wave $I'_3$ is reflected on the cylindrical lateral surface 5 where it is absorbed, for example, by means of an acoustic coating constituted, for example, by varnish deposited on the lateral surface 5, thus allowing obtainment of a single echo delayed signal, without any parasitic echo.

For an input signal of the pulse type such as shown in $E_1$ on Diagram 3a, the output signal of the delay line of FIG. 2 comprises the direct signal $F_2$ (Diagram 3b) of low amplitude, followed directly, i.e. without any parasitic echo, by the single echo signal $S_2$.

By way of illustration, the assignee has produced two transmission-type delay lines according respectively to the two embodiments represented in FIGS. 1 and 2, using for each of them a cylindrical acoustic medium made of glass, having a length l equal to 65 mm, a diameter d equal to 20 mm, whose focusing surface is a spherical cap having a radius of curvature r equal to 130 mm and whose plane surface comprises two piezoelectric transducers spaced apart from each other by a length equal to 15 mm. The angles α (FIG. 1) and α' (FIG. 2) are equal and are about 7°. For each of these two lines, the measured delay is equal to 50 μs for an operating frequency of about 40 MHz. Moreover, the insertion losses produced by each line, i.e. the attenuation of the output signal with respect to the input signal, are in the range of 15 dB.

What is claimed is:

1. An electro-acoustic delay line operating in transmission, comprising:
   an acoustic wave propagation medium having a longitudinal axis and being delimited by at least one lateral surface, a first plane terminal surface and a second terminal surface of revolution ensuring a focusing of said acoustic wave;
   an input transducer and an output transducer transforming an electromagnetic wave into an acoustic wave and vice versa, said two transducers being positioned on said plane terminal surface and being symmetrical with respect to the middle of said plane surface, the acoustic wave produced by said input transducer being perpendicular to said plane terminal surface; wherein the angle formed by the axis of revolution of said second terminal surface passing through the middle of said plane terminal surface and the acoustic wave produced by said input transducer has a value such that said acoustic wave undergoes a single reflection on said focusing surface of revolution and such that the acoustic wave reflected on said surface of revolution is concentrated at the level of said output transducer, thus allowing the obtainment of a single echo delayed signal.

2. A delay line as claimed in claim 1, wherein said input transducer and said output transducer are each positioned adjacent to an edge of said lateral surface of the acoustic medium, each transducer thus being spaced far from the middle of said plane terminal surface.

3. A delay line as claimed in claim 1, further comprising means for absorbing the acoustic wave reflecting on said plane terminal surface at the level of said output transducer, said absorbing means being positioned on said lateral surface of the acoustic medium, so that said single echo delayed signal is free of any parasitic echo.

4. A delay line as claimed in claim 1, wherein said plane terminal surface is perpendicular to the longitudinal axis of the acoustic medium passing through the middle of said plane terminal surface, wherein said terminal surface of revolution and its axis of revolution are constituted respectively by a spherical cap and the straight line passing through the middle of the plane terminal surface and the centre of curvature of the cap, said angle thus being equal to the angle formed by the longitudinal axis of the medium and said straight line, and wherein said straight line passing through said output transducer and said centre of curvature of said cap is parallel to the acoustic wave produced by said input transducer, so that the acoustic wave produced by said input transducer is reflected in a point of said cap located on the straight line passing through the middle of said plane terminal surface and said centre of curvature, the angle of reflection being said angle.

5. A delay line as claimed in claim 4, wherein said lateral surface of the acoustic medium is cylindrical in shape whose axis of symmetry constitutes the longitudinal axis of the medium, and wherein said cylindrical lateral surface has a given length determined as being the distance separating said middle of the plane terminal surface from the tangential point of the spherical cap, the radius of curvature of said cap being substantially equal to twice the length of said cylindrical lateral surface.

6. A delay line as claimed in claim 1, wherein said terminal surface of revolution and its axis of revolution are constituted respectively by a spherical cap and the straight line passing through the middle of the plane terminal surface and the centre of curvature of the cap, wherein said straight line constitutes the longitudinal axis of the acoustic medium so that said cap is centered on the longitudinal axis of the medium, and wherein said angle is equal to the angle formed by said plane terminal surface and the normal at the longitudinal axis of the medium, so that the acoustic wave produced by said input transducer is reflected in a point of the cap located on the longitudinal axis of the medium, the angle of reflection being said angle.

7. A delay line as claimed in claim 6, wherein said lateral surface of the acoustic medium is a cylindrical shape whose axis of symmetry constitutes the longitudinal axis of the medium, wherein said cylindrical lateral surface has a given length determined as being the distance separating said middle of the plane terminal surface from the tangential point of the spherical cap, and wherein the radius of curvature of said cap is substantially equal to twice the length of said cylindrical lateral surface.

8. A delay line as claimed in claim 1, wherein the acoustic wave produced by said input transducer is a volume wave.

9. A delay line as claimed in claim 1, wherein said plane terminal surface and said terminal surface of revolution are polished.

* * * * *